(12) United States Patent
Thompson et al.

(10) Patent No.: US 11,498,046 B2
(45) Date of Patent: Nov. 15, 2022

(54) METHOD AND SYSTEM FOR TETRACHLOROMETHANE SYNTHESIS

(71) Applicant: Phoseon Technology, Inc., Hillsboro, OR (US)

(72) Inventors: Theresa L. Thompson, West Linn, OR (US); Marshall T. Anderson, Portland, OR (US)

(73) Assignee: Phoseon Technology, Inc., Hillsboro, OR (US)

( * ) Notice: Subject to any disclaimer, the term of this patent is extended or adjusted under 35 U.S.C. 154(b) by 580 days.

(21) Appl. No.: 16/455,055

(22) Filed: Jun. 27, 2019

(65) Prior Publication Data

US 2020/0406224 A1 Dec. 31, 2020

(51) Int. Cl.
*B01J 19/12* (2006.01)
*H01L 25/075* (2006.01)
*C01B 32/05* (2017.01)

(52) U.S. Cl.
CPC .............. *B01J 19/121* (2013.01); *C01B 32/05* (2017.08); *H01L 25/0753* (2013.01)

(58) Field of Classification Search
CPC .............. B01J 19/121; B01J 2219/0871; B01J 2219/0877; B01J 19/128; B01J 19/123; B01J 19/12; B01J 19/127; B01J 2219/1203; B01J 2219/00763; B01J 2219/0892; B01J 2219/0801; B01J 2219/00768; C01B 32/05; H01L 25/0753; C07C 17/06; C07C 19/041; C07C 17/10; C07C 19/075

See application file for complete search history.

(56) References Cited

U.S. PATENT DOCUMENTS

| | | | | |
|---|---|---|---|---|
| 6,683,421 B1 * | 1/2004 | Kennedy | ............. | B29C 35/0288 315/149 |
| 2003/0170151 A1 * | 9/2003 | Hunter | ................ | B01J 19/123 422/186.3 |
| 2010/0209294 A1 * | 8/2010 | Owen | .................. | B01J 19/12 422/186.3 |
| 2017/0240437 A1 * | 8/2017 | Duvall | ................ | B01J 19/123 |
| 2019/0030510 A1 * | 1/2019 | Taghipour | ............. | B01J 19/123 |
| 2019/0209718 A1 * | 7/2019 | Church | ................ | B01J 19/123 |
| 2019/0308918 A1 * | 10/2019 | Zeller | .................. | C07C 17/10 |
| 2020/0071246 A1 * | 3/2020 | Schaefer | ............... | B01J 19/123 |

FOREIGN PATENT DOCUMENTS

WO 2018009459 A1 1/2018

* cited by examiner

*Primary Examiner* — Xiuyu Tai
(74) *Attorney, Agent, or Firm* — McCoy Russell LLP

(57) ABSTRACT

Methods and systems are provided for photochemically synthesizing tetrachloromethane in an industrial scale using a plurality of arrays or channels of light emitting diodes. A wavelength output by an SLM lamp is customized to bias the photochemical reaction towards a target reaction and target product and away from a side reaction and side product. The higher yield of the target product improved efficiency and reduces the need for complex purification for removal of the side product.

20 Claims, 4 Drawing Sheets

(1) $CHCl_3 + Cl_2 \xrightarrow{h\nu} CCl_4 + HCl,$ (2) $Cl_2 \xrightarrow{h\nu_1} \cdot Cl + \cdot Cl,$ (3) $CHCl_3 + \cdot Cl \rightarrow \cdot CCl_3 + HCl,$ (4) $CHCl_3 + Cl_2 \rightarrow CCl_4 + \cdot Cl,$ (5) $\cdot CCl_3 + \cdot Cl \rightarrow CCl_4,$ (6) $\cdot Cl + \cdot Cl \rightarrow Cl_2,$ (7) $\cdot CCl_3 + \cdot CCl_3 \rightarrow C_2Cl_6,$ (8) $CCl_4 \xrightarrow{h\nu_2} \cdot CCl_3 + \cdot Cl,$ (9) $CHCl_3 \xrightarrow{h\nu_3} \cdot CCl_3 + \cdot H,$

(10) $CHCl_3 \xrightarrow{h\nu_4} \cdot HCCl_2 + \cdot Cl,$

FIG. 2

METHOD AND SYSTEM FOR TETRACHLOROMETHANE SYNTHESIS

FIELD

The present description relates generally to methods and systems for controlled synthesis of tetrachloromethane using semiconductor light matrix LED technology.

BACKGROUND/SUMMARY

Carbon tetrachloride ($CCl_4$), also widely known as tetrachloromethane, is a valuable feed stock for the synthesis of a variety of commercial chemicals. In particular, tetrachloromethane often serves as the feed stock for the production of chlorine, which is used in paper bleaching and disinfection; in the production of chlorinated propanes, which are used to produce hydrofluoroolefins (HFOs); as well as in the production of chlor-alkalis such as per perchloroethylene, commonly found in household cleaners and adhesives.

Traditionally, photochemical production of tetrachloromethane relied on mercury ultraviolet (UV) bulbs to catalyze the synthesis of tetrachloromethane from chloroform and chlorine. The initiating reaction includes the UV light mediated homolysis of chlorine gas to form chlorine radicals that displace hydrogen in the chloroform to form tetrachloromethane.

However, in addition to emitting UV wavelengths, mercury bulbs also have an emission range extending well into the visible wavelength (e.g., above 500 nm). As a result, several additional reactions can occur, and to varying extents. Depending on the reaction condition, such as reactant concentrations, reaction temperature, flow conditions, etc., the side reactions may terminate or propagate to generate various contaminating side products, such as hexachloroethane ($C_2Cl_6$). In addition to reducing the production efficiency of tetrachloromethane production, side product generation also results in the need for robust purification of the products.

The inventors herein have recognized the above-mentioned issues and have engineered a way to at least partially address them. One example approach for improving tetrachloromethane production includes leveraging solid-state lighting devices, such as semiconductor light matrix (SLM) technology, for more accurate control of the photochemical reaction. As an example, a method may include adjusting a drive current of a semiconductor light matrix (SLM) coupled in a reaction vessel to deliver light of a first wavelength range into the vessel while omitting light of another wavelength range from the vessel, the first wavelength range adapted for a target photochemical reaction, the second wavelength range adapted for an undesired side photochemical reaction.

Solid-state lighting devices may consist of laser diodes or light-emitting diodes (LEDs) as examples. The device typically has an array or several arrays arranged to provide light with a particular profile, such as a long, thin light region, or wider and deeper light regions. The individual elements reside in arrays or parallel and/or series connected emitters to form an individual semiconductor light matrix (or SLM). A lighting device may comprise several arrays, or several arrays arranged in modules, with the lighting device having several modules. Such solid-state lighting devices, also referred to as a semiconductor light matrix (SLM) lamp, may be operated to provide light of a defined wavelength, such as ultraviolet (UV) light, for curing photo sensitive media such as coatings, including inks, adhesives, preservatives, etc. A curing time of these photo sensitive media may be controlled via adjusting intensity of light directed at the photo sensitive media or the amount of time that the photo sensitive media is exposed to light from the solid-state lighting device. As another example, the wavelength of the light may be modified, such as the use of UV lighting devices for ultraviolet germicidal irradiation (UVGI), a disinfection method that uses short-wavelength ultraviolet (UV-C and/or UV-B) light to kill or inactivate microorganisms and enzymes (e.g., RNase). Overall, solid-state lighting devices typically use less power, cost less, and may have easier disposal than current mercury arc lamp devices.

In one example, using SLM technology for improving tetrachloromethane production involves determining optimal wavelengths required for initiating the target photochemical reaction, and selectively providing the optimal wavelength via operation of an SLM light source. Further, wavelengths that contribute to the formation of side products can be identified and the SLM light source can be controlled to ensure that those wavelengths are not supplied. Furthermore, by controlling the intensity of the light produced by the SLM light source, the ratio of desired photochemical reaction to side reactions and unreacted starting materials can be adjusted to improve production efficiency.

The present description may provide several advantages. In particular, the approach may improve the efficiency of the target photochemical reaction, especially in large, industrial scale production applications (such as in the industrial production of tetrachloromethane). Further, the lighting system may be controlled to limit light delivery to defined wavelengths to bias the overall photochemical reaction towards the desired initiation reaction and away from side reactions. As a result, the production of unwanted side products is decreased. Overall, tetrachloromethane production can be scaled up efficiently in a power-effective, and cost-effective manner.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE FIGURES

FIG. 2 depicts example reactions that occur during the photochemical production of tetrachloromethane from chlorine and chloroform.

DETAILED DESCRIPTION

Figure 1:
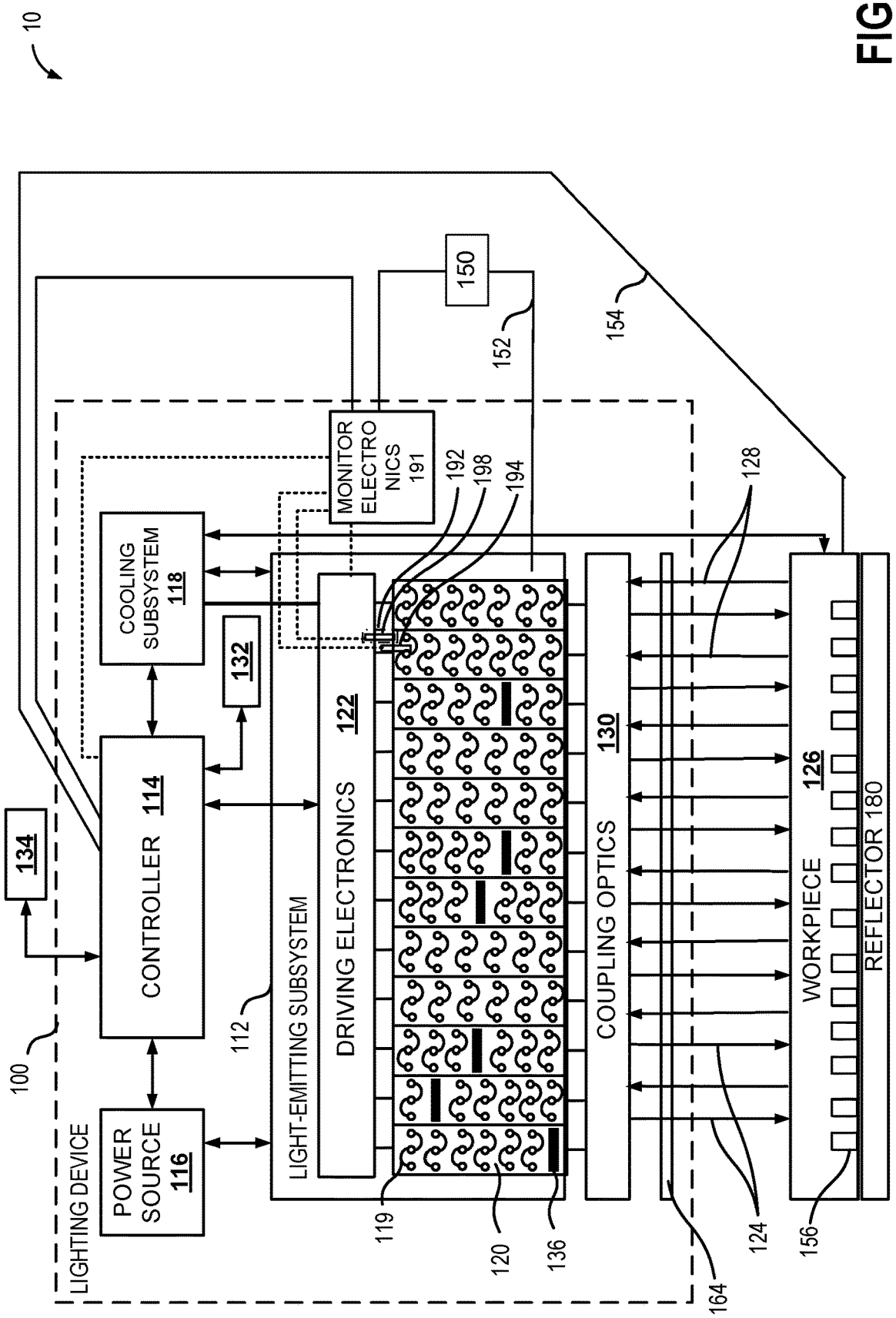
FIG. 1 shows a schematic depiction of a semiconductor lighting system.

The present description is related to a solid state semiconductor lighting system, such as the lighting system of FIG. 1. The lighting system may be operated according to the method of FIG. 3 to increase the yield of tetrachloromethane produced via the reactor system of FIG. 4. In particular, the semiconductor lighting system provides light bands that are narrow and can be shifted so as to provide light of a wavelength for a target photochemical reaction. During the reaction, a drive signal directed to the semiconductor lighting system may be to vary one or more of the wavelength and the irradiance of the light generated by the lighting system. By adjusting the wavelength and the intensity of the light delivered into a reactor, a target photochemical reaction may be selectively promoted while side reactions, such as those described at FIG. 2, are limited.

Referring now to FIG. 1, it illustrates a block diagram for an example configuration of a lighting device 100 that may be included in an irradiation system 10. In one example, lighting device 100 may comprise a light-emitting subsystem 112, a controller 114, a power source 116 and a cooling subsystem 118. The light-emitting subsystem 112 is configured as a solid state lighting system which may comprise a plurality of semiconductor devices 119.

The plurality of semiconductor devices are arranged to provide light bands that are of a narrow wavelength and that can be shifted. In other words, the semiconductor devices are configured to provide a multi-channel lighting system. As one example, the plurality of semiconductor devices may be arranged as single devices, each single device acting as a single light source providing light of a distinct narrow band wavelength. As another example, the plurality of semiconductor devices may be arranged into groups of devices, each group acting as a single light source providing light of a distinct narrow band wavelength. As still another example, the plurality of semiconductor devices may be arranged into linear arrays, each array acting as a single light source providing light of a distinct narrow band wavelength. Further still, the plurality of semiconductor devices may be arranged into two-dimensional arrays, or a matrix, the matrix acting as a single light source providing light of a distinct narrow band wavelength. In this way, the semiconductor lighting system may be configured with one or more light sources, each capable of providing light of a distinct narrow band wavelength, wherein each light source is wavelength stabilized and intensity controlled. By adjusting one or more of the individual light sources (which may be individual semiconductor devices, individual linear arrays, individual matrices, etc.) simultaneously, light of a distinct wavelength can be delivered as and when required to a workpiece.

It will be appreciated that while the examples herein are described with reference to the SLM, this is not meant to be limiting, and may be similarly applied to individual semiconductor light sources, linear arrays, and two-dimensional arrays described above.

In one example, where the plurality of semiconductor devices are arranged as a matrix, the light-emitting subsystem 112 may also be referred to as a semiconductor light matrix (SLM). The plurality of semiconductor devices 119 may alternatively include a linear or two-dimensional array 120 of light-emitting elements such as an array of solid state devices, for example. In one example, the linear or two-dimensional array 120 of light-emitting elements may be divided into groups to create a multiple channel semiconductor light matrix (SLM). Semiconductor devices may provide radiant output 124, including one or more of visible light, ultra-violet (UV) light, and infrared (IR) radiation. The radiant output 124 may be directed to a workpiece 126. Workpiece 126 may be located at a fixed plane from lighting device 100. Alternatively, as described with reference to FIG. 4, the workpiece may be configured as a chamber, such as a reactor chamber, and the lighting system may be immersed therein. Returned radiation 128 may be retro-reflected back to the light-emitting subsystem 112 from the workpiece 126 (e.g., via reflection of the radiant output 124). In some examples, the workpiece 126 may include a retro-reflective surface. In other examples, a retro-reflective surface, such as reflector 180, is positioned behind the workpiece to enable light to be reflected. When included, the reflector may be positioned behind a transparent workpiece 126.

It will be appreciated that while the depicted example shows the semiconductor light sources delivering light to a workpiece, this is not meant to be limiting. In other examples, the semiconductor light sources may deliver light to a single unit container. Further still, the light source may be coupled to a flow through device.

Power source 116 may be configured to provide a drive signal to light emitting subsystem 112 so as to generate the radiant output 124. In one example, power source 116 is a battery. The drive signal may include a drive current, a drive voltage, or an alternate parameter indicative of a drive signal.

The radiant output 124 may be directed to the workpiece 126 via coupling optics 130. The coupling optics 130, if used, may be variously implemented. As an example, the coupling optics may include one or more layers, materials, or other structures interposed between the semiconductor devices 119 and workpiece 126, and providing radiant output 124 to surfaces of the workpiece 126. As an example, the coupling optics 130 may include a micro-lens array to enhance collection, condensing, collimation or otherwise the quality or effective quantity of the radiant output 124. As another example, the coupling optics 130 may include a micro-reflector array. In employing such a micro-reflector array, each semiconductor device providing radiant output 124 may be disposed in a respective micro-reflector, on a one-to-one basis. As another example, a linear array of semiconductor devices 120 providing radiant output 124 may be disposed in macro-reflectors, on a many-to-one basis. In this manner, coupling optics 130 may include both micro-reflector arrays, wherein each semiconductor device is disposed on a one-to-one basis in a respective micro-reflector, and macro-reflectors wherein the quantity and/or quality of the radiant output 124 from the semiconductor devices is further enhanced by macro-reflectors. Lighting device 100 may further include a transparent window 164 (or chamber glass) interposed between the coupling optics 130 and the workpiece 126.

Each of the layers, materials or other structure of coupling optics 130 may have a selected index of refraction. By properly selecting each index of refraction, reflection at interfaces between layers, materials and other structures in the path of the radiant output 124 (and/or retro-reflected radiation 128) may be selectively controlled. As an example, by controlling differences in such indexes of refraction at a selected interface, for example window 164, disposed between the semiconductor devices to the workpiece 126, reflection at that interface may be reduced or increased so as to enhance the transmission of radiant output at that interface for ultimate delivery to the workpiece 126. For example, the coupling optics may include a dichroic reflector where certain wavelengths of incident light are absorbed, while others are reflected and focused to workpiece 126.

The coupling optics 130 may be employed for various purposes. Example purposes include, among others, to protect the semiconductor devices 119, to retain cooling fluid associated with the cooling subsystem 118, to collect, condense and/or collimate the radiant output 124, to collect, direct or reject retro-reflected radiation 128, or for other purposes, alone or in combination. As a further example, the lighting device 100 may employ coupling optics 130 so as to enhance the effective quality, uniformity, or quantity of the radiant output 124, particularly as delivered to the workpiece 126.

As a further example, coupling optics 130 may comprise a cylindrical lens through which light emitted from the linear array of light-emitting elements is directed. As previously described, light emitted from the linear array of light-emitting elements may be incident at an incident face of the cylindrical lens, and may be collimated and redirected out of an emitting face of the cylindrical lens. The cylindrical lens may include one or more of a rod lens, a semi-circular lens, a plano-convex lens, a bi-convex lens, and a faceted Fresnel lens. The cylindrical lens may include a cylindrical lens having a cylindrical power axis and an orthogonal plano-axis, for collimating and/or focusing the light emitted from the linear array 120 of semiconductor devices 119.

Selected of the plurality of semiconductor devices 119 may be coupled to the controller 114 via driving electronics 122, so as to provide data to the controller 114. As described further below, the controller 114 may also be implemented to control such data-providing semiconductor devices, e.g., via the driving electronics 122. The controller 114 may be connected to, and may be implemented to control, the power source 116, and the cooling subsystem 118. Moreover, the controller 114 may receive data from power source 116 and cooling subsystem 118. In one example, the irradiance at one or more locations at the workpiece 126 surface may be detected by sensors and transmitted to controller 114 in a feedback control scheme. In a further example, controller 114 may communicate with a controller of another lighting system (not shown in FIG. 1) to coordinate control of both lighting systems. For example, controller 114 of multiple lighting systems may operate in a master-slave cascading control algorithm, where the set point of one of the controllers is set by the output of the other controller. Other control strategies for operation of lighting device 100 in conjunction with another lighting system may also be used. As another example, controller 114 for multiple lighting systems arranged side by side may control lighting systems in an identical manner for increasing uniformity of irradiated light across multiple lighting systems. As yet another example, controller 114 may adjust a drive current applied to the light-emitting subsystem 112 based on feedback regarding the radiant output 124 (e.g., based on whether the irradiance is at or within a threshold of a target value).

In addition to the power source 116, cooling subsystem 118, and light-emitting subsystem 112, the controller 114 may also be connected to, and implemented to control internal element 132, and external element 134. Element 132, as shown, may be internal to the lighting device 100, while element 134, as shown, may be external to the lighting device 100, but may be associated with the workpiece 126 (e.g., handling, cooling or other external equipment) or may be otherwise related to a photoreaction (e.g. curing) that lighting device 100 supports.

The data received by the controller 114 from one or more of the power source 116, the cooling subsystem 118, the light-emitting subsystem 112, and/or elements 132 and 134, may be of various types. As an example, the data may be representative of one or more characteristics associated with coupled semiconductor devices 119. As another example, the data may be representative of one or more characteristics associated with the respective light-emitting subsystem 112, power source 116, cooling subsystem 118, internal element 132, and external element 134 providing the data. As still another example, the data may be representative of one or more characteristics associated with the workpiece 126 (e.g., representative of the radiant output energy or spectral component(s) directed to the workpiece). Moreover, the data may be representative of some combination of these characteristics.

The controller 114, in receipt of any such data, may be implemented to respond to that data. For example, responsive to such data from any such component, the controller 114 may be implemented to control one or more of the power source 116, cooling subsystem 118, light-emitting subsystem 112 (including one or more such coupled semiconductor devices), and/or the elements 132 and 134. As an example, responsive to data from the light-emitting subsystem indicating that the light energy is insufficient at one or more points associated with the workpiece, the controller 114 may be implemented to either (a) increase the power source's supply of power (e.g., drive current or voltage) to one or more of the semiconductor devices, (b) increase cooling of the light-emitting subsystem via the cooling subsystem 118 (e.g., certain light-emitting devices, if cooled, provide greater radiant output), (c) increase the time during which the power is supplied to such devices, or (d) a combination of the above. As another example, responsive to the data being indicative of a wavelength of the light, light energy of an alternate wavelength may be delivered.

Individual semiconductor devices 119 (e.g., LED devices) of the light-emitting subsystem 112 may be controlled independently by controller 114. For example, controller 114 may control a first group of one or more individual LED devices to emit light of a first intensity, wavelength, and the like, while controlling a second group of one or more individual LED devices to emit light of a different intensity, wavelength, and the like. The first group of one or more individual LED devices may be within the same linear array 120 of semiconductor devices, or may be from more than one linear array of semiconductor devices 120 from multiple lighting devices 100. Linear array 120 of semiconductor device may also be controlled independently by controller 114 from other linear arrays of semiconductor devices in other lighting systems. For example, the semiconductor devices of a first linear array may be controlled to emit light of a first intensity, wavelength, and the like, while those of a second linear array in another lighting system may be controlled to emit light of a second intensity, wavelength, and the like.

As a further example, under a first set of conditions (e.g. for a specific work piece, photoreaction, and/or set of operating conditions) controller 114 may operate irradiation system 10 to implement a first control strategy, whereas under a second set of conditions (e.g. for a specific work piece, photoreaction, and/or set of operating conditions) controller 114 may operate irradiation system 10 to implement a second control strategy. As described above, the first control strategy may include operating a first group (e.g., a first sub lighting array) of one or more individual semiconductor devices (e.g., LED devices) to emit light of a first intensity, wavelength, and the like, while the second control strategy may include operating a second group (e.g., a second sub lighting array) of one or more individual LED devices to emit light of a second intensity, wavelength, and the like. The first group of LED devices may be the same group of LED devices as the second group, and may span one or more arrays of LED devices, or may be a different group of LED devices from the second group, and the different group of LED devices may include a subset of one or more LED devices from the second group.

The cooling subsystem 118 may be implemented to manage the thermal behavior of the light-emitting subsystem 112. For example, the cooling subsystem 118 may provide for cooling of light-emitting subsystem 112, and more specifically, the semiconductor devices 119. The cooling subsystem 118 may also be implemented to cool the workpiece 126 and/or the space between the workpiece 126 and the lighting device 100 (e.g., the light-emitting subsystem 112). For example, cooling subsystem 118 may comprise an air or other fluid (e.g., water) cooling system. Cooling subsystem 118 may also include cooling elements such as cooling fins attached to the semiconductor devices 119, or linear array 120 thereof, or to the coupling optics 130. For example, cooling subsystem may include blowing cooling air over the coupling optics 130, wherein the coupling optics 130 are equipped with external fins to enhance heat transfer.

The lighting device 100 may be used for various applications. Examples include, without limitation, curing applications ranging from displays, photoactive adhesives, and ink printing to the fabrication of DVDs and lithography, as well as decontamination applications (e.g., ultraviolet germicidal irradiation). The applications in which the lighting device 100 may be employed can have associated operating parameters. That is, an application may have associated operating parameters as follows: provision of one or more levels of radiant power, at one or more wavelengths, applied over one or more periods of time. In order to properly accomplish the photoreaction or decontamination associated with the application, optical power may be delivered at or near the workpiece 126 at or above one or more predetermined levels of one or a plurality of these parameters (and/or for a certain time, times or range of times).

In order to follow an intended application's parameters, the semiconductor devices 119 providing radiant output 124 may be operated in accordance with various characteristics associated with the application's parameters, e.g., temperature, spectral distribution and radiant power. At the same time, the semiconductor devices 119 may have certain operating specifications, which may be associated with the semiconductor devices' fabrication and, among other things, may be followed in order to preclude destruction and/or forestall degradation of the devices. Other components of the lighting device 100 may also have associated operating specifications. These specifications may include ranges (e.g., maximum and minimum) for operating temperatures and applied electrical power, among other parameter specifications.

Accordingly, the lighting device 100 may support monitoring of the application's parameters. In addition, the lighting device 100 may provide for monitoring of semiconductor devices 119, including their respective characteristics and specifications. Moreover, the lighting device 100 may also provide for monitoring of selected other components of the lighting device 100, including its characteristics and specifications.

Providing such monitoring may enable verification of the system's proper operation so that operation of lighting device 100 may be reliably evaluated. For example, lighting device 100 may be operating improperly with respect to one or more of the application's parameters (e.g. temperature, spectral distribution, radiant power, and the like), any component's characteristics associated with such parameters, and/or any component's respective operating specifications.

The provision of monitoring may be responsive to and carried out in accordance with the data received by the controller 114 from one or more of the system's components.

Monitoring may also support control of the system's operation. For example, a control strategy may be implemented via the controller 114, the controller 114 receiving and being responsive to data from one or more system components. This control strategy, as described above, may be implemented directly (e.g., by controlling a component through control signals directed to the component, based on data respecting that components operation) or indirectly (e.g., by controlling a component's operation through control signals directed to adjust operation of other components). As an example, a semiconductor device's radiant output may be adjusted indirectly through control signals directed to the power source 116 that adjust power applied to the light-emitting subsystem 112 and/or through control signals directed to the cooling subsystem 118 that adjust cooling applied to the light-emitting subsystem 112.

In some applications, high radiant power may be delivered to the workpiece 126. Accordingly, the light-emitting subsystem 112 may be implemented using an array of light-emitting semiconductor devices 120. For example, the light-emitting subsystem 112 may be implemented using a high-density light-emitting diode (LED) array. Although linear arrays of light-emitting elements may be used and are described in detail herein, it is understood that the semiconductor devices 119, and linear arrays 120 thereof, may be implemented using other light-emitting technologies without departing from the principles of the invention. Examples of other light-emitting technologies include, without limitation, organic LEDs, laser diodes, and other semiconductor lasers.

Continuing with FIG. 1, the plurality of semiconductor devices 119 may be provided in the form of one or more arrays 120, or an array of arrays (e.g., as shown in FIG. 1). The arrays 120 may be implemented so that one or more or most of the semiconductor devices 119 are configured to provide radiant output. At the same time, however, one or more of the array's semiconductor devices 119 may be implemented so as to provide for monitoring selected of the array's characteristics. One or more monitoring devices 136 may be selected from among the devices in the array and, for example, may have the same structure as the other, emitting semiconductor devices. For example, the difference between emitting and monitoring may be determined by the semiconductor driving electronics 122 associated with the particular semiconductor device (e.g., in a basic form, a semiconductor light source array may have monitoring devices where the coupling electronics provide a reverse current, and emitting LED devices where the coupling electronics provide a forward current).

Furthermore, based on coupling electronics, selected of the semiconductor devices in the array may be either/both multifunction devices and/or multimode devices, where (a) multifunction devices may be capable of detecting more than one characteristic (e.g., either radiant output, temperature, magnetic fields, vibration, pressure, acceleration, and other mechanical forces or deformations) and may be switched among these detection functions in accordance with the application parameters or other determinative factors and (b) multimode devices may be capable of emission, detection and some other mode (e.g., off) and may be switched among modes in accordance with the application parameters or other determinative factors.

A radiation monitor 190, or radiation monitoring device, for monitoring radiation output by the lighting device 100 may include a first sensor 194, a second sensor 198 and monitor electronics 191. In one example, the radiation monitor is a potentiometer. Furthermore, the radiation monitor 190 may include a radiation filter 192. In one example, the radiation filter 192 may comprise a device or structure coupled to the second sensor 198. In one example, the radiation filter 192 may be coupled directly to the second sensor; in other examples, the radiation filter 192 may be coupled indirectly with the second sensor. In other examples, the radiation filter may include a structure separate from the second sensor that, when taken in conjunction with positioning of the second sensor, serves as a spatial radiation filter to exclude the radiation output directly from the lighting device from reaching the second sensor while allowing radiation output from external sources to be received at the second sensor. In other words, the radiation filter 192 may shield the second sensor 198 from the radiation output directly by the light-emitting element while allowing the radiation from external sources to reach the second sensor, while the radiation output directly from the light-emitting element and the radiation from external sources are incident at the first sensor 194.

Monitor electronics 191 may be coupled to the light emitting system via a temperature sensor 150. In one example, a device or structure 152 may couple the monitor electronics 191 to the temperature sensor 150. In still other examples, monitoring electronics 191 may include in-line monitors coupled directly to workpiece 126. The in-line monitors may be configured to monitor product generation at the workpiece. Based on a monitored ratio of target product relative to side product generated during a photochemical reaction occurring in workpiece 126, monitored by one or more sensors of the monitoring electronics 191, a signal may be sent to controller 114 to adjust the drive signal of the light sources. For example, a drive current or voltage may be adjusted to narrow the wavelength band provided by the light source. As another example, a temperature of the light source may be adjusted, via signals sent to cooling subsystem 118, to narrow the band wavelength of light being delivered by the light source. Temperature control of the semiconductor light source may be used for managing characteristics of the narrow band of wavelengths. For example, temperature control may be used to substantially center the light source over a selected wavelength, such as by maintaining the wavelength of the light source within a 5 nm band of the target wavelength.

Examples of the radiation filter 192 may include a mounting means for positioning the second and/or first sensors, and light capillaries. Furthermore, shielding the second sensor 198 from the radiation output directly from the light-emitting element while allowing the radiation from external sources to reach the second sensor may be implemented by one or more of positioning the second sensor 198 at a non-light-emitting side of a light-emitting plane of the light-emitting element 119, supporting the light-emitting element 119 on a base interposed between a printed circuit board of the lighting device 100 and the light-emitting element 119 to facilitate positioning the second sensor 198 at the non-light emitting side of the light-emitting plane of the light-emitting element 119, and coupling a light capillary to the second sensor 198.

The first sensor 194 and the second sensor 198 may include thermocouples. In another example, the first sensor 194 and the second sensor 198 may include photodiodes. In other examples, first sensor 194 and the second sensor 198 may include another type of photosensor or radiation sensor. The radiation monitor 190 may be a standalone device (as shown at the bottom of FIG. 1), and may be retrofit to existing lighting devices for monitoring the power (or radiation intensity) output therefrom. Retrofitting the radiation monitor 190 with a lighting device 100 may include positioning the first sensor 194 and second sensor 198 adjacent to a light-emitting element of the lighting device 100. Additionally, the radiation monitor 190 may be more closely integrated (as shown in FIG. 1) with a lighting device by conductively coupling the monitor electronics 191 with driving electronics 122 and/or controller 114 of the lighting device. In this way, the lighting device operation may be modulated or controlled responsively to measurements from the radiation monitor 190, including responsively to signals from the first and second sensors 194 and 198 and monitor electronics 191.

For example, the controller 114 may adjust power source 116 and/or cooling subsystem 118 in response to data received from monitor electronics 191. In one example, a lower than threshold radiation output measured by the radiation monitor 190 for a given power input from power source 116 may indicate that the lighting device 100 may be overheated. In this case, the controller 114 may adjust cooling subsystem 118 to increase a cooling capacity delivered to the light-emitting subsystem 112 to reduce a temperature threat. In a further example, multiple lighting devices 100 may each include integrated radiation monitors 190 for measuring the radiation output therefrom and for coordinating control of both lighting systems in parallel. For example, controller 114 of multiple lighting systems may operate in a master-slave cascading control algorithm, where the set point of one of the controllers is set by the output of the other controller. Other control strategies for operation of lighting device 100 in conjunction with another lighting system may also be used.

The channels or arrays 120 of the SLM may be positioned relative to UV photosensors 156 (e.g., photointerrupter sensors) via a motorized linear stage 155 based on control signals 154 received at the linear stage from controller 114. The photosensors 156 may be photodiodes, for example, and may transmit an output signal 153 to controller 114 corresponding to a detected amount of irradiance. The linear stage may include a motor, such as a stepper motor, to adjust the position of the SLM, optics, etc. As an example, the photosensors 156 may be positioned at a specific location on the surface of, or inside a cavity defined by, workpiece 126, and a position of the channels or arrays 120 of the SLM may be adjusted along one or more axes by the motorized linear stage 155 so that the SLM is centered above the photosensors 156.

As one example, the lighting system of FIG. 1 can be included in a reactor system for commercial or industrial grade photochemical reactions, particularly bulk or large scale industrial syntheses. One such reactor system is shown with reference to FIG. 4. The inventors herein have recognized that the semiconductor light source of FIG. 1 can be used to boost the production of tetrachloromethane. In particular, by adjusting both the light intensity, as well as the wavelengths of the light emitted by the semiconductor light source, target photochemical reactions related to tetrachloromethane production can be promoted while side reactions can be limited. The photochemical reactions involved in tetrachloromethane production are depicted at FIG. 2. By using the semiconductor light source of FIG. 1 for photochemical syntheses that are targeted to specific wavelengths corresponding to the bond dissociation energies of reactants, while concurrently specifically omitting wavelengths (if any) that contribute to formation of side reactants, production efficiencies are improved and yields are enhanced. It will be appreciated that while the current disclosure pertains to the application of semiconductor lighting technology to making tetrachloromethane ($CCl_4$, carbon tetrachloride) from a mixture of chloroform ($CHCl_3$) and chlorine gas ($Cl_2$) reactants, this is not meant to be limiting, and other photochemical reactions can be similarly enabled without departing from the scope of this invention.

Traditionally photochemical production of tetrachloromethane used mercury UV bulbs to catalyze the synthesis. These bulbs emit UV wavelengths but also have an emission range extending up well into the visible wavelengths (above 500 nm).

Equations in FIG. 2 demonstrate the potential reactions and products that may occur as a result of splitting the $Cl_2$ into individual chlorine atoms in an excited state (·Cl). Also shown are reactions that may occur when a medium pressure UV bulb is used as the source, thereby providing a large range of wavelengths including those needed for the side reactions.

The summary photochemical equation is shown at FIG. 2 as equation (1) wherein:

$CHCl_3 + Cl_2 \rightarrow CCl_4 + HCl$, and where $hv$ is light.

The desired initiating reaction is shown at equation (2):

$Cl_2 \rightarrow ·Cl + ·Cl$, wherein light of a first defined wavelength, defined as $hv_1$, is used for light mediated homolysis of chlorine gas to form radicals that subsequently displace hydrogen in the chloroform (of equation 1) to form tetrachlormethane.

However, there are several additional reactions that may occur, and to varying extents, depending on reaction conditions such as reactant concentrations, temperature of reaction, wavelengths applied, and flow rate (if the reaction occurs in a continuous reactor). Some of the side reactions may terminate or propagate the reaction.

For example, equation (3): $CHCl_3 + ·Cl \rightarrow ·CCl_3 + HCl$, allows for propagation of the reaction. Likewise, equation (4): $CHCl_3 + Cl_2 \rightarrow CCl_4 + ·Cl$, allows for propagation of the reaction. In comparison, equation (5): $·CCl_3 + ·Cl \rightarrow CCl_4$, allows for production of the desired end product.

Equation (6): $·Cl + ·Cl \rightarrow Cl_2$, depicts a reaction that is the reverse of the initiating homolysis, and which thereby terminates the reaction.

Side reaction depicted by equation (7): $·CCl_3 + ·CCl_3 \rightarrow C_2Cl_6$, generates a contaminating side product, hexachloroethane ($C_2Cl_6$), which also terminates the reaction.

The above theoretical reaction model relies on ·Cl to drive the reaction and omits other reactions that may contribute to undesired side product formation that can also be initiated by light. For example, if light of a different wavelength (hv2) as compared to the light of equation 2 (hv1) is impinged, the resulting radicals, as shown in equation 8: $CCl_4 \rightarrow ·CCl_3 + ·Cl$, can in turn feed the side reaction of equation (7) to produce hexachloroethane. As another example if light of yet another different wavelength (hv3) is impinged, the resulting radicals, as shown in equation (9): $CHCl_3 \rightarrow ·CCl_3 + ·H$, can also potentially feed the side reactions of equation 7 to produce hexachloroethane. Still another such side reaction triggered by light of a further wavelength (hv4) is shown at equation (10): $CHCl_3 \rightarrow ·HCCl_2 + ·Cl$, which potentially feeds the side reaction of equation 7 above to produce hexachloroethane.

Generation of additional $·CCl_3$ (as per equations 8 and 10) presents an issue in that it can skew the reaction balance towards production of the contaminating side product $C_2Cl_6$.

As a consequence, the desired product (tetrachloromethane) would require more robust purification from the larger relative amount of undesirable side product. While flow rate (in a continuous reactor) or reactant ratio can be used to control side product production, the optimal solution is to significantly reduce production of the contaminant. As elaborated with reference to the method of FIG. 3, a wavelength output by the semiconductor lighting system of FIG. 1, when implemented in a continuous flow reactor, such as the reactor system of FIG. 4, may enable light delivery to be limited to the wavelengths and intensities corresponding to the desired initiation, propagation, and termination reactions, while concurrently disabling wavelengths corresponding to the unwanted side reactions.

Figure 4:
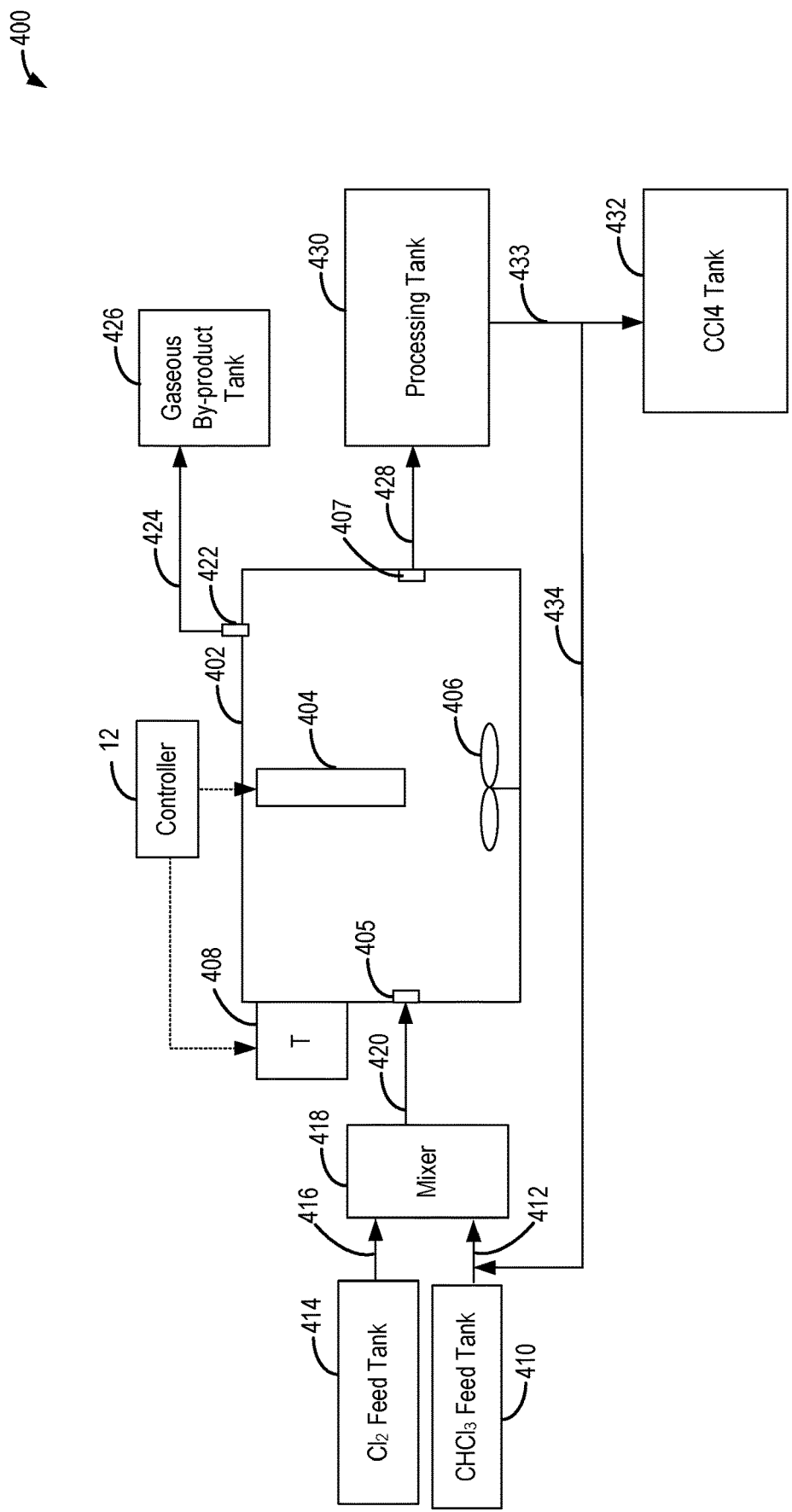
FIG. 4 shows an example reactor system for producing tetrachloromethane using light generated by a semiconductor lighting system.

Turning now to FIG. 4, an example reactor system 400 is shown. The reactor system 400 enables the industrial scale production of tetrachloromethane via a photochemical reaction, wherein the source of the photochemical reaction is a semiconductor light source, such as the semiconductor lighting system of FIG. 1. As a result, the desired reactions depicted in FIG. 2 can be enabled while the side reactions depicted in FIG. 2 are limited. Overall, the production efficiency of tetrachloromethane is enhanced by improving yields and reducing the need for extensive purification.

Reactor system 400 includes a reaction vessel (or reactor chamber) 402 within which the photochemical reaction is performed. A semiconductor light source, such as an SLM lamp 404, is coupled inside the reaction vessel's chamber for providing light of a desired wavelength and intensity. In the depicted example, SLM lamp 404 is hung from a top of the vessel, such that the light can be directed towards the side and the bottom of the vessel. However, it will be appreciated that other modes of attachment of the light source to the vessel may be envisaged, such as providing the light from a bottom of the vessel, shining upwards, or from a side of the vessel. Reaction vessel 402 further includes an inlet 405 for receiving feedstock chemicals, an outlet 407 for releasing product chemicals, and a vent 422 for releasing pressure within the vessel as well as for release gaseous side products or by-products from the chamber.

Chloroform, drawn from chloroform feed tank 410, is combined with chlorine, drawn from chlorine feed tank 414 at mixer 418. Various valves, pumps, and sensors may be coupled to the chloroform and chlorine feed stream 412, 414, respectively, so that a defined ratio of the feed stocks can be premised at mixer 418. Following the mixing, the mixed intake stream 420 is delivered to inlet 405 of the reaction vessel. In some examples, a portion of carbon tetrachloride, generated at the reaction vessel 402, is mixed with the chloroform feed stream via recycle stream 434 to form a reactant pre-mixture. Chlorine is then combined (via, for example, an inline sparger) with the reactant pre-mixture, which contains chloroform, to form a reactant mixture that is delivered to the reaction vessel 402. In such a scenario, the chloroform may be mixed or agitated prior to introduction of the chlorine at in-line mixer 418. In other embodiments, the mixture including the chlorine, chloroform, may be agitated at mixer 418 prior to introduction into reaction vessel 402.

In the reaction vessel 402, light of a target wavelength, generated via SLM lamp 404, is applied to trigger a desired photochemical reaction whereby chloroform is converted to carbon tetrachloride using a free radical generated from chlorine. In particular, an output wavelength and intensity of irradiance from SLM lamp may be controlled by controller 12. In one example, controller 12 may adjust a voltage or current output by the SLM lamp, such as via the circuit of FIG. 3, to provide the desired wavelength range that is optimal for chloroform to carbon tetrachloride conversion. The resulting products are released from an outlet 407 of the vessel, via product stream 428, to a processing tank 430.

During the reaction inside vessel 402, agitator or mixer 406 ensures continuous mixing of reactants drawn from the corresponding feed tanks. In addition, a temperature of the reaction vessel 402 may be controlled to optimize the target photochemical reaction over side reactions. Temperature control may be achieved via a temperature regulating device 408 which may enable cooling or heating of reaction vessel 402. Temperature regulating device 408 may be controlled by controller 12 based on sensor input from a temperature sensor (not shown) coupled to the reaction vessel, the intake stream 420, or product stream 428.

The resultant carbon tetrachloride product is removed from reaction vessel 402 via outlet 407 as product stream 428. As such, product stream 428 is a crude product stream which can also include one or more of chloroform, chlorine, and hydrogen chloride, as well as other by-products at relatively low levels. Gaseous byproducts of the reaction in vessel 402, such as hydrogen chloride and chlorine, may be removed from reaction vessel 402 via vent 422 to form gaseous by-product stream 426. This stream may be processed in gaseous by-product tank 426. For example, the gaseous by-products may be neutralized for disposal or further separated to isolate chlorine and hydrochloric acid, which may then be used in other synthetic chemical processes. Furthermore, at least a portion of the chlorine release from the vent may be recirculated back to the chlorine feed tank following processing at tank 426.

The crude products in product stream 428 are routed to processing tank 430 for post-production processing. In one example, tank 430 may be a degassing tank, where the crude product stream can be concentrated by removal of light constituents such as chlorine and hydrogen chloride. These light constituents may be directed to by-product processing tank 426 upon separation from the carbon tetrachloride. Alternatively, the concentrated crude product stream can be routed out of the system via carbon tetrachloride product stream 433, and directed for storage in $CCl_4$ tank 432 for subsequent use. In other embodiments, product streams 428 and/or 433 may be subjected to additional processing steps, such as to photochlorinate any residual chloroform within the product stream or product purification steps. Further, at least a portion of the produced carbon tetrachloride may be directed into the chloroform feed stream 416 via recycle stream 434 to generate a premixture that is then delivered to the reaction vessel of the continuous flow reaction system.

While the depicted example shows the semiconductor light source positioned in the chamber where the photochemical reaction is taking place, in other examples, the reaction may occur inside a flow through device, such as a clear pipe or clear container into and through which the reacting chemicals are continuously flowed, and the semiconductor light source may be positioned outside of the reaction container. As an example, a first reactant may be flowing continuously through the clear pipe, and another reactant may be added to it at a location at or upstream of the region where the semiconductor light source delivers light. In such an embodiment, while the reactants flow through the clear container, light of the target wavelength is impinged on the reactants via the semiconductor light source, enabling the target photochemical reaction to occur. The products of the photochemical reaction are continuously flowed out of the reaction chamber while new reactants flow in. In all cases, the photochemical reaction is initiated when the semiconductor light source is turned on, and the reaction is terminated when the light source is turned off.

Based on a ratio of the target product of the photochemical reaction and the side products, as sensed via one or more sensors of the reactor system 400, a controller may adjust one or more settings of the reactor system. For example, responsive to a rise in side product generation, the controller may adjust the flow of reactants into and out of the reactor (e.g., decrease the flow to allow for a longer duration of exposure to the narrow band of light from the semiconductor light source). Additionally or optionally, the controller may adjust a drive signal of the semiconductor light source to vary the intensity and/or wavelength band. Further still, the controller may adjust the temperature settings of the reaction vessel and/or the semiconductor light source. For example, the temperature of the reaction chamber may be controlled via adjustments to the settings of temperature regulating device 408. Alternatively, a temperature of the semiconductor light source may be adjusted via adjustments to a cooling subsystem (such as cooling subsystem 118 of FIG. 1). For example, the semiconductor light source may be cooled to ensure that the narrow band of light being provided by the light source is more accurately centered over the target wavelength.

It will be appreciated that while the depicted process and reactor system is a continuous process in a continuous flow reactor system wherein reactants are continuously fed to a reactor and product is continuously removed from the reactor, this is not meant to be limiting. In other systems, the reactor may be operated in batches.

Still other modifications to the system of FIG. 4 may be enabled without departing from the scope of the present invention. For example, chlorine and chloroform may be directly injected into the reaction vessel without premixing. As another example, the reactor system may be operated to provide for flow of material from the bottom to the top of the reactor, or the flow of the material can be reversed such that inputs are received at the top of the reactor and the product is removed from the bottom of the reactor. The reaction vessel inlet 405 may include a dispersing device such as a sparger or dip tube, and/or may be configured to include multiple inlets.

While the depicted embodiment shows the reaction vessel with one SLM lamp 404, in other examples there may be multiple lamps. The one or more lamps may be at least partially immersed within the reaction medium contained within reaction vessel 402. Various sensors, pumps, and valves may be included in the reactor system, such as for controlling reactant flow, product flow, etc.

The reaction vessel may be initially charged with carbon tetrachloride to form an initial medium in which the reaction takes place. The reactor may be devoid or substantially devoid of chloroform at the beginning of the reaction so as to avoid having excess chloroform relative to chlorine at any point in the reaction. Once the reaction is underway, the appropriate balance of chlorine and chloroform, and hence carbon tetrachloride as well, within reaction vessel 402, may be maintained by regulating the chlorine, chloroform, and optionally carbon tetrachloride inputs into reaction vessel 402.

Figure 3:
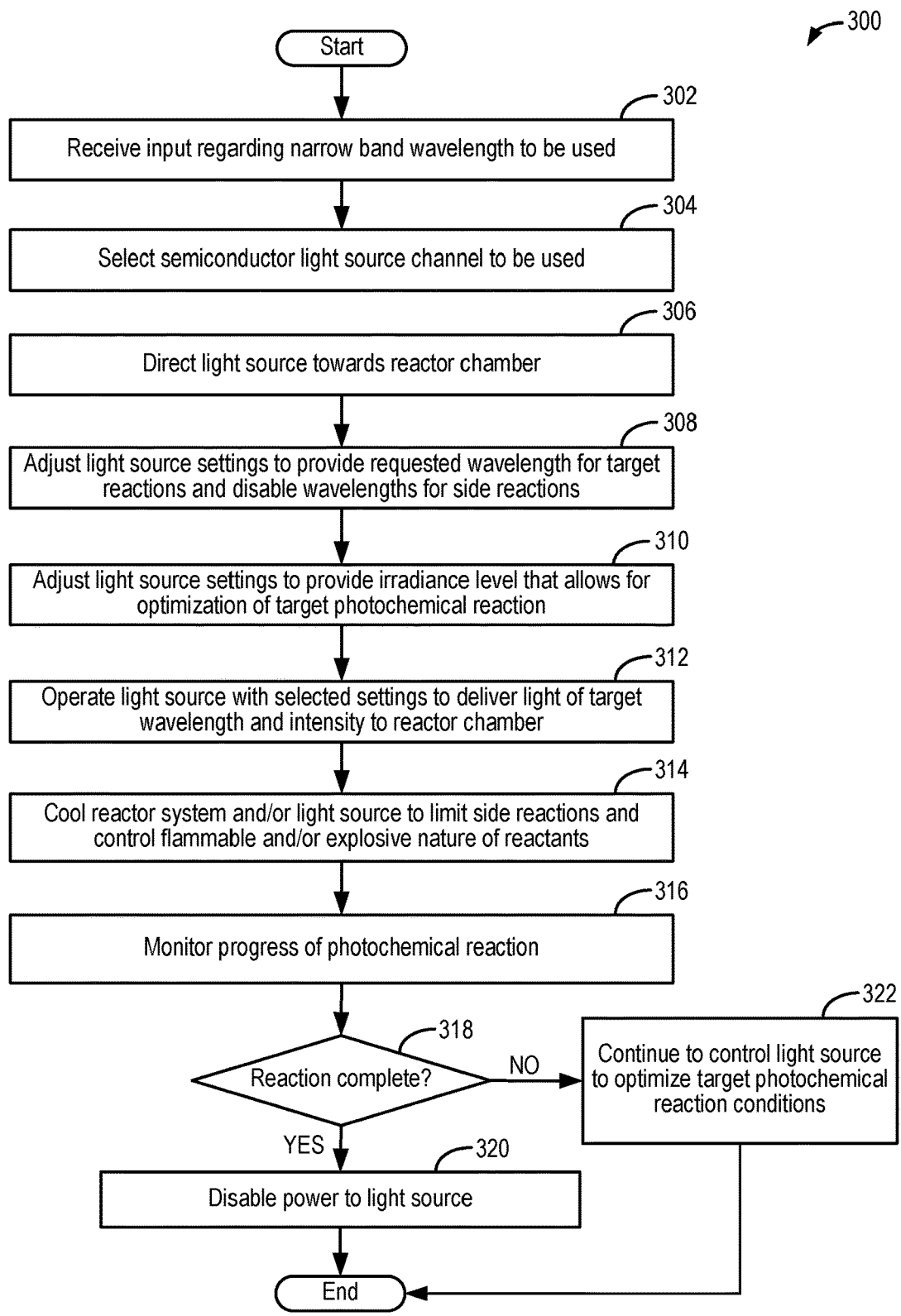
FIG. 3 shows an example flowchart of a method for tetrachloromethane production using an SLM LED light source.

Turning now to FIG. 3, an example method 300 is shown for operating a semiconductor light source, which may be an SLM array lighting device, or SLM lamp for example, to photochemically synthesize carbon tetrachloride from chlorine and chloroform. In one example, the lamp is operated in a reactor that produces carbon tetrachloride at an industrial or commercial scale. For example, the lamp may be coupled to a flow through device in the reactor system of FIG. 4. Instructions for carrying out method 300 may be executed by a controller (e.g., controller 114 of FIG. 1, or controller 12 of FIG. 4) based on instructions stored on a memory of the controller and in conjunction with signals received from sensors of the lighting device, such as the sensors described above with reference to FIG. 1. The controller may employ components and actuators of the lighting system to adjust a radiation output, according to the methods described below.

At 302, the method includes receiving input regarding a narrow band wavelength to be used for the target photochemical reaction. In one example, the input includes operator input selecting a wavelength for the target photochemical reaction. In another example, the narrow band wavelength is retrieved from a memory of the controller in response to an operator selection of a target photochemical reaction. As an example, the selected wavelength may be the wavelength(s) needed to initiate the targeted reaction (see equation 2 of FIG. 2) inducing homolysis of chlorine (from equations 11 and 12 below). In one example, the controller's memory may be populated with information regarding wavelengths required for selected photochemical reactions. The wavelength(s) needed for initiation, propagation, and termination of the targeted photochemical reaction may have been calculated a priori by the controller or an operator and stored in a look-up table. In some examples, wavelength(s) corresponding to the undesired side photochemical reactions may also have been calculated and stored in the controller's memory. As an example, the wavelength(s) corresponding to the side reactions may be those depicted by equations 7-10 of FIG. 2.

The optimal wavelengths needed for the target reaction, as well as the wavelengths for the side reactions, may have been calculated from the bond dissociation energies of the initiating reaction. For example, the energy required may be calculated according to equation (11) as:

$$E=\text{Energy/photon}(J/\text{photon})=(\text{Bond Dissociation Energy})\times((1 \text{ mole of photons})/(\text{Avogadro's number photons/mole}))\times(1000 \ J/kJ) \quad (11)$$

The target wavelength is then determined according to equation (12) as:

$$\lambda=((h\times c)/E)\times(10^9 \text{ nanometers/meter}) \quad (12)$$

wherein $\lambda$=wavelength, $E=hc/\lambda$, E=Energy/bond=Energy/photon=Bond dissociation energy (kJ/mole) X Avagadro's number X (1000)/kJ, h=Plank's constant=$6.626\times10^{-34}$ J·s, c=Speed of light=$3.00\times10^8$ m/s, BDE=Bond Dissociation Energy as measured at 298 degrees Kelvin, Avogadro's number=6 $0.022\times10^{23}$ photons/mole.

As an example, the wavelength required for dissociation of the C—Cl bond, as shown in equations 8 and 10, where the BDE is 338 kJ/mole ($hv_2$ and $hv_4$), can be determined as:

$$E=338kJ/\text{mole}\times(1 \text{ mole}/6.022\times10^{23} \text{ photons})\times(1000J/kJ)=5.62\times10^{-19}J/\text{photon}$$

$$\lambda=(6.626\times10^{-34}Js)\times(3.00\times10^{\hat{}}8m/s)/(5.62\times10^{-19}J)$$
$$=3.54\times10^{-7}m=353\times10^{-9}m=354 \text{ nm. Thus, these reactions require light of a wavelength of 354 nm.}$$

As another example, the wavelength required for the dissociation of the Cl—Cl bond as shown in equation 2 where the BDE is 242.58 kJ/mole ($hv_1$), can be determined as:

$$E=242.58kJ/\text{mole}\times(1 \text{ mole}/6.022\times10^{23} \text{ photons})\times(1000J/kJ)=4.03\times10^{-19}J/\text{photon}$$

$$\lambda=(6.626\times10^{-34}J\cdot s)\times(3.00\times10^{\hat{}}8m/s)/(4.03\times10^{-19}J)$$
$$=4.93\times10^{-7}m=493\times10^{-9}m=493 \text{ nm. Thus, these reactions require light of a wavelength of 493 nm.}$$

As still another example, the wavelength required for the dissociation of the H—C bond as shown in equation 9 where the BE is 337.2 kJ/mole ($hv_3$), can be determined as:

$$E=337.2kJ/\text{mole}\times(1 \text{ mole}/6.022\times10^{23} \text{ photons})\times(1000J/kJ)=5.6\times10^{-19}J/\text{photon}$$

$$\lambda=(6.626\times10^{-34}J\cdot s)\times(3.00\times10^{\hat{}}8m/s)/(5.6\times10^{-19}J)$$
$$=3.54\times10^{-7}m=353\times10^{-9}m=355 \text{ nm. Thus, these reactions require light of a wavelength of 355 nm.}$$

In one example, an SLM matrix with a 495 nm wavelength LED has a wavelength range of full width half max (FWHM) from 477.6 nm to 513.2 nm. This range of wavelengths potentially delivered to the target reaction specifically does not include wavelengths below 400 nm (such as 354 nm and 355 nm) that could result in the specific initiation and propagation of side reactions. Omission of wavelengths below 400 nm, while not sufficient to prevent side reactions, will result in a decrease in overall production of undesirable side products. The decrease in side products results in a larger percentage of the desired synthesis product in the final reaction mixture. In another example, the visible light range of the LEDs covers 460-550 nm.

At 304, the method includes selecting a semiconductor light source channel to be used for the target photochemical reaction. For example, where the semiconductor light source includes a plurality of linear arrays, each linear array configured for a distinct narrow band wavelength of light, the controller may select a linear array suited for the target photochemical reaction based on the narrow band wavelength delivered by that array relative to the wavelength desired for the target photochemical reaction, as retrieved at 302. In one example, the selecting may include the controller selecting a number of LEDs or LED arrays to operate to provide the target wavelength(s).

At 306, the method includes turning on the semiconductor light source and directing the semiconductor light source towards the reactor chamber. For example, one or more motors of the semiconductor light source may be operated to ensure that the light from the light source will be delivered into a reaction chamber, such as inside reaction vessel 402 of FIG. 4, or outside of a clear reaction chamber of a flow through device.

At 308, the method includes adjusting semiconductor light source settings to more reliably deliver light of the selected narrow band wavelength for the targeted photochemical reactions. Concurrently, the settings may disable the wavelengths for the side reactions. For example, the controller may adjust a drive signal, such as current or voltage settings of a circuit of the semiconductor light source so as to power the selected channels that will deliver the target wavelength.

At 310, the method includes adjusting semiconductor light source settings to provide an irradiance (or intensity) level that allows for optimization of the target photochemical reactions. In one example, the irradiance level is higher than a threshold, such as a "Hi Irradiance" setting of the semiconductor lamplight source. The controller may also select a number of semiconductor light sources and/or arrays to operate to provide the target irradiance. The intensity level of the semiconductor light source may be controlled in a feedback manner responsive to one or more feed stocks flow rates (that is, chlorine and chloroform) flowing into the reaction vessel, and the flow rate of product out of the reaction vessel. In addition, the intensity may be dynamically adjusted, in real time, as a function of the composition of reactants or product as a percentage of effluent in the continuous feed reactors. The effluent and or reaction mixture may be monitored through various methods including infrared (IR), RAMAN, Mass Spectroscopy, absorbance spectroscopy, or any of a number of other methods. For example, monitoring of the reaction effluent of a flow through reactor can use in-line IR to estimate the percentage of product in the effluent. The lamp irradiance is then adjusted in accordance (such as through adjustment of the current or voltage) to maximize or optimize the target photochemical reaction. Additionally or alternatively, a flow rate of the reactants entering the reaction chamber may be adjusted in response to the sensed percentages.

As an example, in response to an increase in the sensed ratio of target product to side product in the effluent from the reaction chamber of the continuous flow reactor, the controller may adjust a drive signal directed to the semiconductor light source to increase the irradiance. Alternatively, the controller may reduce the flow rate of reactants entering the reaction chamber.

At 312, the method includes operating the light source with the selected settings to deliver light of the selected wavelength and intensity into the reactor chamber. As a result, a photochemical reaction is provided and tetrachloromethane can be generated without the use of a metal based catalyst, such as $TiO_2$. By continuously monitoring the ratio of target product and side product of the reaction, and adjusting semiconductor light source settings in accordance, a higher product efficiency is also achieved.

At 314, the method includes adjusting temperature settings of the reactor system and/or the semiconductor light source to limit the side reactions and optimize the target reactions. The temperature control may include feedback adjustments based on the sensed levels of the target product to the side product in the effluent from the reaction chamber.

Adjusting the temperature settings of the reactor may include warming or cooling the reaction vessel, such as via temperature regulator 408 of FIG. 4. The vessel may be liquid- or air/gas-cooled or heated. In one example, the gas used for cooling the reaction vessel may be inert to maximize the cooling potential of the gas. As an example, the controller may cool the reactor system to a temperature setting of below 149° C. (to limit the possibility of a chorine iron fire in the reaction chamber or associated steel tubing) or, preferably a range of 25° C. to 50° C. and more preferably to 35° C. so as to limit the side reactions of the photochemical chlorination process, as well as to control the flammable and/or explosive nature of the reactants with materials used in the containment of the reaction. Note, however that the reaction temperature may be maintained at a high level (such as near 160° C.), if desired, in order to optimize the chemical reaction(s).

Temperature control of the light source may also be performed so as to manage the characteristics of the narrow band of wavelength being delivered. For example, cooling of the light source may be used to reduce secondary emissions which can contribute to a rise in the ratio of the side products. Thus, responsive to the rise in side products relative to target products, the controller may cool the semiconductor light source channel delivering the target wavelength (such as via cooling subsystem 118 of FIG. 1), so as to center the wavelength of the channel over the target wavelength, thereby enabling a rise in the target products relative to side products. In one example, the temperature control may be used to shift the wavelength being delivered by the semiconductor light source to within 5 nm of the target wavelength.

At 316, while the photochemical reaction is occurring, a progress of the reaction may be monitored via input from one or more system sensors. An attribute, or multiple attributes, of the reaction products or of the reactants may be monitored. Reaction progress may be monitored by one of several types of in-line monitors. The types of monitors may include: temperature, pressure, flow rate (for a flow-through reactor this will give a measure of dwell time in the reactor), spectrophotometers or spectrometers (monitoring of UV and/or visible characteristics), IR spectrometers (monitoring of IR characteristics), and mass spectrometer (monitoring molecular weights). The forgoing examples do not preclude or limit the types, placement or number of monitors that may be used for a particular chemical reaction. As described earlier, based on the monitoring, the attributes of the light source may be continuously adjusted. For example, irradiance levels and temperature settings of the light source may be adjusted responsive to the ratio of the target product relative to the side products. The continuous monitoring allows for the efficiency of the target reaction to be increased.

At 318, it may be determined if the reaction is complete. In one example, the reaction may be deemed to be complete after a threshold duration has elapsed since the reaction was initiated, such as where the reaction is in a dedicated chamber. As another example, the reaction may be deemed to be complete responsive to sensor input from one or more of the reaction vessel, an inlet stream delivering feedstock to the reaction vessel, and an outlet stream receiving products from the reaction vessel. Further still, the reaction may be deemed complete when a threshold amount of target product has been generated. If the reaction is complete, then at 320, the method includes disabling power to the light source. By disabling the power, and turning the light off, the photochemical reaction is immediately terminated. In particular, the chemical reaction will terminate on its own once the driving energy (the initiating light wavelength) is withdrawn. Thus the photochemical reaction is generally either on or off, in sync with the light source.

Else, at 322, the controller may continue to control the light source to optimize the target photochemical reaction conditions. For example the controller may continue to adjust reactor flow rates, reactor temperature, light source temperature, and light source drive signals based on target product to side product levels.

In other examples, such as where the reactor is a continuous flow reactor, in response to the information supplied by the in-line monitor(s), the controller can adjust irradiance delivered to the reaction through adjustment of current to the light emitting subsystem. Optionally the controller may introduce additional wavelengths by turning on additional channels. For example, during the production of tetrachloromethane from $Cl_2$ and $CHCl_3$, in either a batch or flow-through photochemical reactor, an IR monitoring the disappearance of the CH wag peak (~1250 $cm^{-1}$) relative to the CCl stretch peak (~750 $cm^{-1}$) can be used to monitor reaction progress and expected relative yield. The controller can then increase or decrease the delivered irradiance as flow of reactants is changed for flow-through design reactors.

In this way, a semiconductor light source may be tailored to provide light of wavelengths required for a specific photochemical reaction, thereby ensuring that the desired reaction product(s) are generated. By calculating the required wavelengths from the bond dissociation energies needed for a given initiating homolytic or heterolytic cleavage, other wavelengths can be specifically omitted from the light source. With reference to the above example, the photochemical generation of tetrachloromethane can be scaled up by omitting wavelengths corresponding to the bond dissociation energy of the C—Cl bond, such as by omitting wavelengths at or around 354 nm.

By using a semiconductor light source, such as an SLM lamp, to enable a photochemical reaction, wavelengths that promote a target reaction can be selectively provided and wavelengths that may catalyze side reactions and competing back reactions can be reliably omitted. As a result, target product yields are improved. By also adjusting the irradiance levels output by the light source, the photochemical reactions may be better optimized. By relying on a higher performance photochemical reaction, the need for metal based catalysts to catalyze the chlorination reaction is reduced. In addition, the use of solid state light sources reduces the need for expensive and difficult to use UV bulbs. Further, a more stable delivery of irradiance can be provided over time. An overall economic advantage is achieved from the lower side product formation and therefore the need for fewer and easier purification steps later in the process.

As will be appreciated by one of ordinary skill in the art, the methods described in FIG. 3 may represent one or more of any number of processing strategies such as event-driven, interrupt-driven, multi-tasking, multi-threading, and the like. As such, various steps or functions illustrated may be performed in the sequence illustrated, in parallel, or in some cases omitted. Likewise, the order of processing is not necessarily required to achieve the objects, features, and advantages described herein, but is provided for ease of illustration and description. Although not explicitly illustrated, one of ordinary skill in the art will recognize that one or more of the illustrated steps or functions may be repeatedly performed depending on the particular strategy being used.

This concludes the description. The reading of it by those skilled in the art would bring to mind many alterations and modifications without departing from the spirit and the scope of the description. For example, lighting sources producing different wavelengths of light may take advantage of the present description.

One example method comprises: adjusting a drive current of a semiconductor light matrix (SLM) coupled in a reaction vessel to deliver light of a first wavelength range into the vessel while omitting light of another wavelength range from the vessel, the first wavelength range adapted for a target photochemical reaction, the second wavelength range adapted for an undesired side photochemical reaction. In the preceding example, additionally or optionally, the first wavelength range generates energy exceeding a bond dissociation energy of the target photochemical reaction, and the second wavelength range generates energy exceeding the bond dissociation energy of the side photochemical reaction, the side photochemical reaction generating a different product than the target photochemical reaction. In any or all of preceding examples, additionally or optionally, the first wavelength range includes wavelengths adapted to each of an initiation, propagation, and termination phase of the target photochemical reaction(s), and the second wavelength range includes wavelengths adapted to each of an initiation, propagation, and termination phase of the side photochemical reaction(s). In any or all of preceding examples, additionally or optionally, the drive current is further adjusted to deliver the light at an irradiance level adapted for each phase of the target photochemical reaction. In any or all of preceding examples, additionally or optionally, the method further comprises monitoring a progress of the target photochemical reaction, including inferring the phase of the target photochemical reaction, based on sensor input from a sensor coupled to the reaction vessel. In any or all of preceding examples, additionally or optionally, the reaction vessel in coupled in a continuous flow reactor assembly. In any or all of preceding examples, additionally or optionally, the method further comprises adjusting, via a temperature regulator, a temperature of the reaction vessel as a function of the phase of the target photochemical reaction. In any or all of preceding examples, additionally or optionally, the semiconductor light matric includes arrays of light-emitting diodes configured to emit light in a visible spectrum. In any or all of preceding examples, additionally or optionally, the target photochemical reaction includes photochemical synthesis of tetrachloromethane from chloroform and chlorine, and wherein the side photochemical reaction includes the photochemical synthesis of hexachloroethane from chloroform and chlorine. In any or all of preceding examples, additionally or optionally, the first wavelength range is configured to generate energy meeting or exceeding the bond dissociation energy of a chlorine-chlorine bond, and wherein the second wavelength is configured to generate energy meeting or exceeding the bond dissociation energy of a carbon-chlorine bond.

Another example method comprises operating a semiconductor light matrix (SLM) coupled in a reaction vessel to selectively deliver light limited to a first wavelength range into the vessel; and enabling photochemical synthesis of tetrachloromethane from chlorine and chloroform in the vessel via the light of the first wavelength range. In any or all of preceding examples, additionally or optionally, the light of the first wavelength range includes a first wavelength, a second wavelength, and a third wavelength, and wherein the SLM matrix is operated to deliver the light at the first wavelength during an initiation phase of the photochemical synthesis, deliver the light at the second wavelength during a propagation phase of the photochemical synthesis, and deliver the light at the third wavelength during a termination phase of the photochemical synthesis, the wavelengths may be the same, different, or absent (in the case of the termination phase). In any or all of preceding examples, additionally or optionally, the method further comprises adjusting an irradiance level output by the SLM matrix during the photochemical synthesis via changes to a drive current of the SLM matrix, the irradiance level adjusted to optimize each phase of the photochemical synthesis. In any or all of preceding examples, additionally or optionally, selectively delivering light limited to the first wavelength range into the vessel includes not delivering light of a second wavelength range into the vessel, the first wavelength range based on a bond dissociation energy of a chlorine-chlorine bond triggering the photochemical synthesis, the second wavelength range selected based on the bond dissociation energy of a carbon-chlorine bond triggering a side, undesired, reaction of the photochemical synthesis.

An example reactor system comprises: a reactor chamber; an intake conduit for receiving chloroform and chlorine in the chamber; a product conduit for receiving products of a target photochemical reaction involving chloroform and chlorine from the chamber; a semiconductor light matrix (SLM) lamp comprised of a plurality of light emitting diode arrays, the SLM lamp coupled to the reactor chamber; and a controller with computer readable instructions stored on non-transitory memory that when executed cause the controller to deliver light output by the SLM matrix into the reactor chamber, the light of a wavelength adapted to enable the target photochemical reaction over a side reaction using at least one of the chloroform and the chlorine. In any or all of preceding examples, additionally or optionally, the controller includes further instructions that cause the controller to: upon receiving the reactants of a photochemical reaction in the chamber, apply a drive current to the SLM to deliver light of a first wavelength into the chamber to initiate the target photochemical reaction synthesizing tetrachloromethane from the chlorine and chloroform; then, after a duration, apply another drive current to the SLM to deliver light of a second wavelength into the chamber to propagate the target photochemical reaction via the light of the second wavelength; and finally, after another duration, apply a further drive current to the SLM to deliver light of a third wavelength into the chamber to terminate the target photochemical reaction via the light of the third wavelength. In any or all of preceding examples, additionally or optionally, one or more of the first, second, and third wavelengths limit the side reaction including photochemical synthesis of hexachloroethane from the chlorine and the chloroform. In any or all of preceding examples, additionally or optionally, the controller includes further instructions that when executed cause the controller to, after terminating the photochemical reaction, transfer the tetrachloromethane containing reaction mixture from the reaction chamber to a product tank, via the product conduit, for degassing and removal of residual chlorine and chloroform as well as contaminating side products. In the case of a flow through reactor this would be the final transfer of tetrachloromethane containing reaction mixture generated in a particular synthesis run for further purification. In any or all of preceding examples, additionally or optionally, the reactor further includes a temperature regulator for controlling a temperature of the reactor chamber, and wherein the controller includes further instructions for adjusting the temperature of the reactor chamber via the temperature regulator responsive to a phase of the target photochemical reaction.

The invention claimed is:

1. A method, comprising:
   operating a semiconductor light source coupled to a reaction vessel to selectively deliver light of a narrow band wavelength into the reaction vessel while omitting light outside the narrow band wavelength from the reaction vessel, the narrow band wavelength adapted for a target photochemical reaction involving chloroform and chlorine without use of a metal based catalyst, light outside the narrow band wavelength adapted for an undesired side photochemical reaction; and
   while operating the semiconductor light source, adjusting a drive signal of the semiconductor light source based on a sensed ratio of a product of the target photochemical reaction relative to a contaminating side product of the undesired side photochemical reaction in an effluent from the reaction vessel.

2. The method of claim 1, wherein the semiconductor light source includes multiple channels, each channel generating light of a distinct wavelength range, and wherein operating the semiconductor light source includes selecting a channel from the multiple channels based on the target photochemical reaction.

3. The method of claim 1, wherein the narrow band wavelength generates energy meeting or exceeding a bond dissociation energy of the target photochemical reaction, and the light outside the narrow band wavelength generates energy exceeding the bond dissociation energy of the undesired side photochemical reaction, the contaminating side product of the undesired side photochemical reaction different than the product of the target photochemical reaction.

4. The method of claim 2, wherein adjusting the drive signal of the semiconductor light source includes adjusting a drive current or a drive voltage of the selected channel.

5. The method of claim 1, wherein the drive signal is adjusted to deliver the light at an irradiance level selectively adapted for the target photochemical reaction.

6. The method of claim 1, further comprising, monitoring a progress of the target photochemical reaction based on sensor input from one or more sensors coupled to the reaction vessel.

7. The method of claim 6, wherein the reaction vessel is coupled in a continuous flow reactor assembly, and wherein the semiconductor light source is coupled inside or outside of the reaction vessel.

8. The method of claim 1, further comprising, adjusting, via a temperature regulator, one or more of a vessel temperature of the reaction vessel and a temperature of the semiconductor light source as a function of the sensed ratio of the product of the target photochemical reaction relative to the contaminating side product of the undesired side photochemical reaction in the effluent from the reaction vessel.

9. The method of claim 8, wherein the adjusting includes, responsive to a drop in the sensed ratio of the product of the target photochemical reaction relative to the contaminating side product of the undesired side photochemical reaction in the effluent from the reaction vessel, cooling the reaction vessel and/or cooling the semiconductor light source.

10. The method of claim 1, wherein the semiconductor light source includes one or more of individual light emitting diodes, linear arrays of light-emitting diodes, and two-dimensional matrices of light emitting diodes, each configured to emit light in a visible spectrum.

11. The method of claim 2, wherein the target photochemical reaction includes photochemical synthesis of tetrachloromethane from chloroform and chlorine, and wherein the undesired side photochemical reaction includes the photochemical synthesis of hexachloroethane from chloroform and chlorine.

12. A method, comprising:
   operating a channel of a semiconductor light source coupled to a reaction vessel to selectively deliver light limited to a first wavelength range into the reaction vessel;
   enabling photochemical synthesis of tetrachloromethane from chlorine and chloroform in the reaction vessel via the light of the first wavelength range;
   during the photochemical synthesis, sensing a ratio of a target product of the photochemical synthesis relative to a contaminating side product in an effluent from the reaction vessel, the contaminating side product generated from a side reaction of the photochemical synthesis due to impingement of light outside the first wavelength range; and
   adjusting an irradiance level output by the channel of the semiconductor light source during the photochemical synthesis based on the sensed ratio.

13. The method of claim 12, wherein adjusting the irradiance level output by the channel of the semiconductor light source during the photochemical synthesis based on the sensed ratio comprises adjusting a drive signal of the semiconductor light source to optimize each phase of the photochemical synthesis, the drive signal including a drive current or a drive voltage of the semiconductor light source.

14. The method of claim 12, wherein sensing the ratio of the target product of the photochemical synthesis relative to the contaminating side product in the effluent from the reaction vessel comprises monitoring the effluent via spectroscopy, and wherein adjusting the irradiance level output by the channel of the semiconductor light source during the photochemical synthesis based on the sensed ratio includes increasing the irradiance level responsive to a decrease in the sensed ratio.

15. The method of claim 12, further comprising, responsive to a decrease in the sensed ratio, performing one or more of decreasing a flow rate of reactants through the reaction vessel, changing a vessel temperature of the reaction vessel, and lowering a temperature of the channel of the semiconductor light source.

16. A reactor system, comprising:
a reactor chamber;
an intake conduit for receiving chloroform and chlorine in the reactor chamber;
a product conduit for receiving products of a target photochemical reaction involving chloroform and chlorine from the reactor chamber;
a semiconductor lamp including a plurality of channels, each channel comprised of a plurality of solid state light sources, each channel configured to generate light of a distinct wavelength, the semiconductor lamp coupled to the reactor chamber; and
a controller with computer readable instructions stored on non-transitory memory that when executed cause the controller to:
    select a channel from the plurality of channels, the selected channel producing light of a target wavelength adapted to enable the target photochemical reaction over a side reaction using at least one of the chloroform and the chlorine and without use of a metal based catalyst; and
    operate the channel to output light of the target wavelength into the reactor chamber at an irradiance level optimized for the target photochemical reaction, including adjusting a drive signal of the channel based on a ratio of a product of the target photochemical reaction relative to a contaminating side product of the side reaction.

17. The system of claim 16, further comprising one or more sensors for sensing a level of the product of the target photochemical reaction relative to a level of the contaminating side product of the side reaction in an effluent from the reactor chamber, and a temperature regulator for controlling a temperature of the reactor chamber, and wherein the controller includes further instructions that cause the controller to:
monitor, via the one or more sensors, a progress of the target photochemical reaction over the side reaction in the reactor chamber;
determine the ratio of the product of the target photochemical reaction relative to the contaminating side product of the side reaction from the monitored progress; and
responsive to a drop in the ratio of the product of the target photochemical reaction relative to the contaminating side product of the side reaction, increase a flow rate of chloroform or chlorine through the reactor chamber, and/or lower the temperature of the reactor chamber.

18. The system of claim 17, wherein the distinct wavelength of the channel limits the side reaction including photochemical synthesis of hexachloroethane from the chlorine and the chloroform.

19. The system of claim 17, wherein the controller includes further instructions that when executed cause the controller to:
terminate the photochemical reaction by disabling the channel of the semiconductor lamp; and
after terminating the photochemical reaction, transfer tetrachloromethane from the reactor chamber to a product tank, via the product conduit, for degassing and removal of residual chlorine and chloroform.

20. The system of claim 17, wherein the semiconductor lamp includes a cooling system for cooling the plurality of solid state light sources, and wherein the controller includes further instructions for lowering a channel temperature of the channel of the semiconductor lamp responsive to the drop in the ratio of the product of the target photochemical reaction relative to the contaminating side product of the side reaction.

* * * * *